CONTROLLABLE SEMI-CONDUCTOR DEVICES COMPRISING MAIN AND AUXILIARY THYRISTORS HAVING ALL EXCEPT ONE EMITTER-LAYER IN COMMON

Filed July 7, 1967

3 Sheets-Sheet 1

INVENTOR.
PER SVEDBERG
AND BENGT-ARNE VEDIN

INVENTOR.
PER SVEDBERG
AND BENGT-ARNE VEDIN

INVENTOR.
PER SVEDBERG
AND BENGT-ARNE VEDIN

United States Patent Office 3,526,815
Patented Sept. 1, 1970

3,526,815

CONTROLLABLE SEMI-CONDUCTOR DEVICES COMPRISING MAIN AND AUXILIARY THYRISTORS HAVING ALL EXCEPT ONE EMITTER-LAYER IN COMMON

Per Svedberg, Vallingby, and Bengt-Arne Vedin, Kungsangen, Sweden, assignors to Allmanna Svenska Elektriska Aktiebolaget, Vasteras, Sweden, a Swedish corporation Filed July 7, 1967, Ser. No. 651,764
Claims priority, application Sweden, July 7, 1966, 9,292/66
Int. Cl. H01l *11/10*
U.S. Cl. 317—235 17 Claims

ABSTRACT OF THE DISCLOSURE

A controllable semi-conductor device comprises a main thyristor and an auxiliary thyristor; the thyristors comprise a common semi-conductor body with a first emitter-layer, a first main electrode connected to the emitter layer, base-layers and a control electrode common to both the main and auxiliary thyristors; the thyristors have separate second emitter-layers; the second emitter-layer of the auxiliary thyristor is connected to the adjacent base-layer.

BACKGROUND OF THE INVENTION

Field of the invention

The present invention relates to a controllable semi-conductor device.

The prior art

With controllable semi-conductor devices, for example thyristors, it is often of vital importance that the ratio between the power controlled by the semi-conductor and the control power supplied to the semi-conductor is as great as possible. A certain minimum level of the control current is required for a thyristor in order to ensure ignition and so that the firing time of the thyristor is maintained at a low value thus enabling a rapid increase in the current through the thyristor. A high power thyristor needs a considerable control power and in large converter plants, where several thyristors are series and parallel-connected, the total control power required will be rather great. The control power must usually be transmitted between points between which often high potential differences prevail and expensive and space-consuming equipment is therefore necessary. It is therefore extremely advantageous if the necessary control power can be reduced.

Particularly with series-connected thyristors a circuit consisting of a capacitor in series with a resistor is usually connected in parallel with each thyristor. When a thyristor is ignited the energy stored in the corresponding capacitor is discharged through the thyristor. For various reasons it is desirable to keep the time constant of these RC circuits as low as possible and it is therefore important that the thyristors have a good firing tolerance, that is during the interval immediately after the starting of the ignition process, the capacity to carry a high current without damage.

SUMMARY OF THE INVENTION

The invention provides a particularly advantageous device in this respect. A semi-conductor device according to the invention is characterised in that it comprises a main thyristor and at least one auxiliary thyristor, these thyristors having a common semiconductor body, the auxiliary thyristor having a first emitter-layer, a first main electrode connected to this, the base-layers and a control electrode in common with the main thyristor, the thyristors however having separate second emitter-layers, this layer in the auxiliary thyristor having considerably less area than in the main thyristor, and the second emitter-layer of the auxiliary thyristor being electrically connected by means of an outer connection to the common base-layer for the thyristors which is adjacent this second emitter-layer.

BRIEF DESCRIPTION OF THE DRAWINGS

The invention will be more fully described with reference to the accompanying drawings where.

DESCRIPTION OF THE PREFERRED EMBODIMENTS

Figure 1:
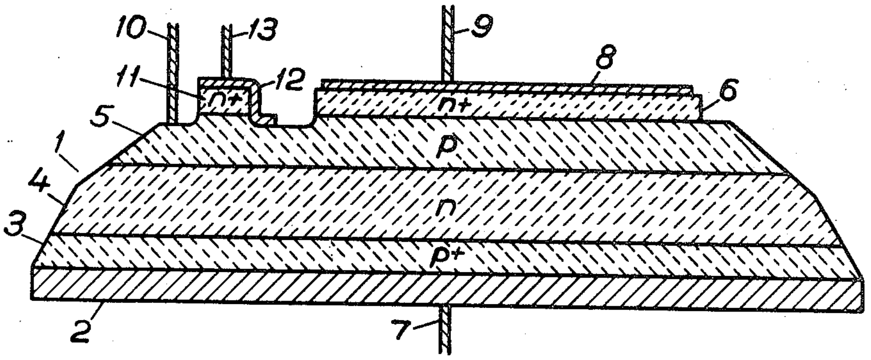
FIG. 1 shows a section through a semi-conductor device according to the invention.
Figure 2:
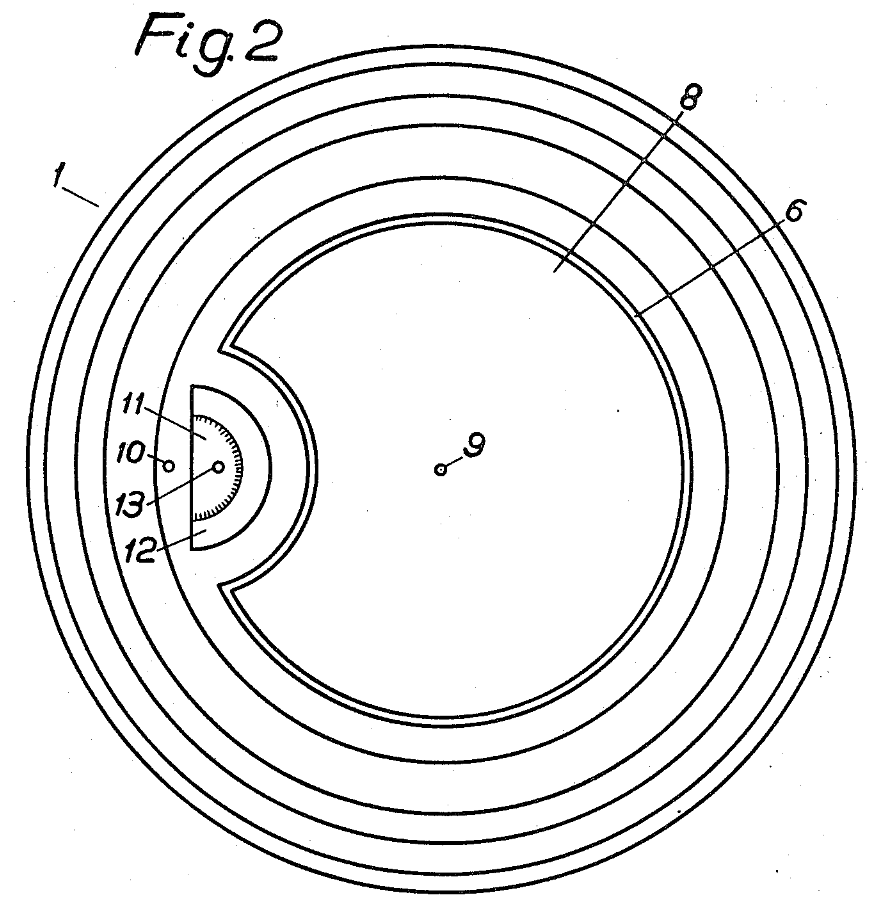
FIG. 2 shows the same device seen from the cathode side, FIGS. 3 and 4 views of a semi-conductor device provided with two cascade-connected auxiliary thyristors, FIG. 5 an alternative arrangement of the connection between the N-emitter and P-base of an auxiliary thyristor and FIG. 6 the semi-conductor device according to the invention connected in an electrical circuit for controlling the current through a load.
Figure 3:
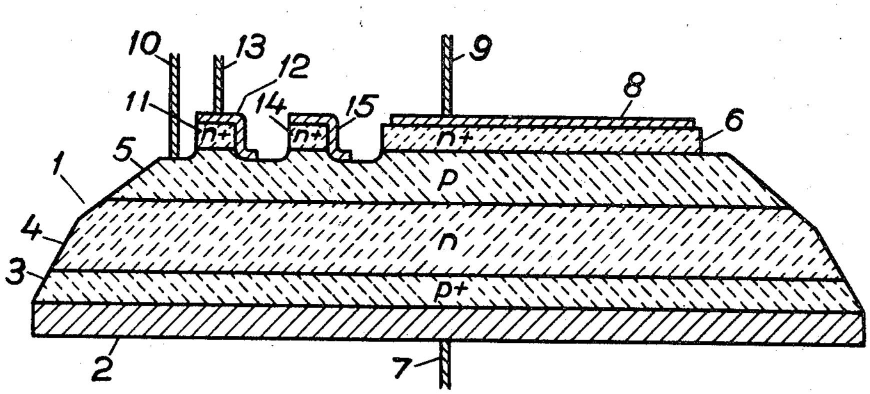
Figure 4:
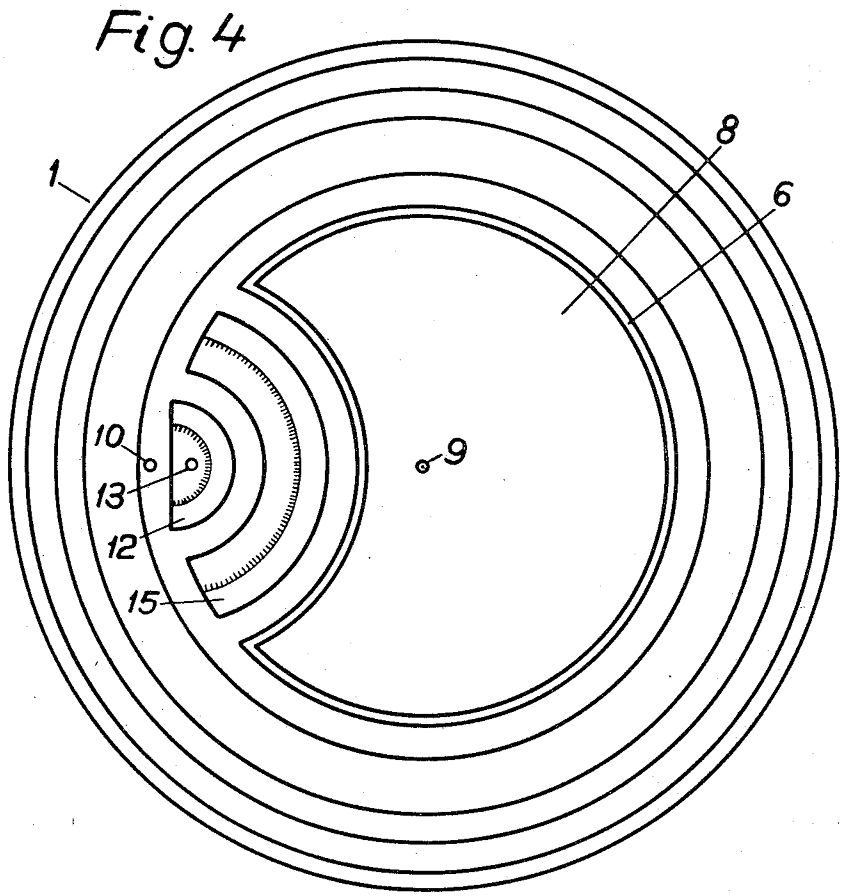
Figure 5:
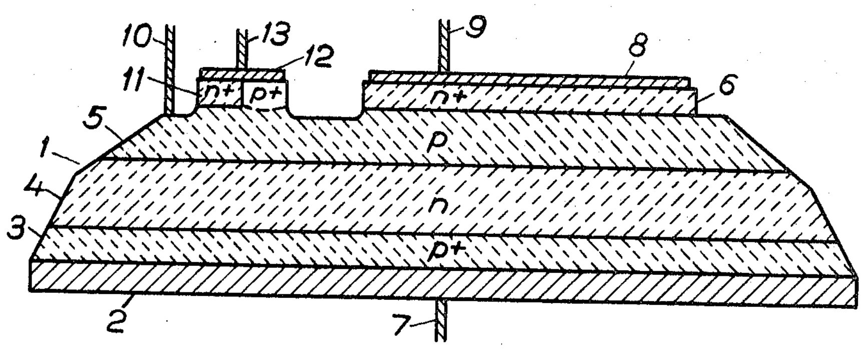
Figure 6:
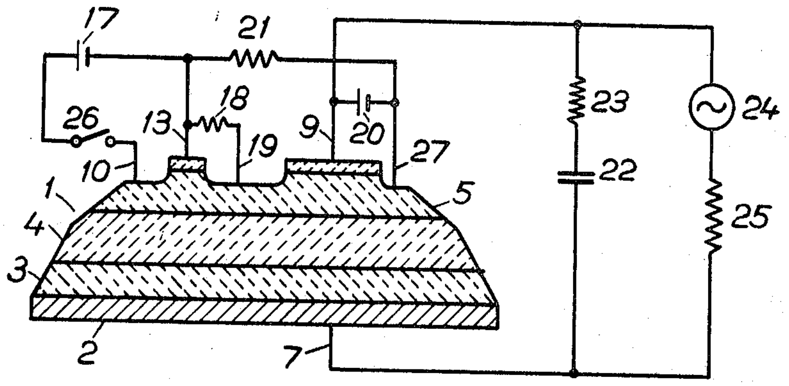

The semi-conductor body 1 shown in FIGS. 1 and 2, for example of silicon, rests on a base plate 2 of, for example, molybdenum. By means of doping in known manner a P-conducting layer 3, the P-emitter, and N-conducting layer 4, the N-base and a P-conducting layer 5, the P-base, have been generated in the semi-conductor body. On top of the last layer, on the central part of the upper surface of the body, is an N-conducting layer 6, the N-emitter, on which a metal contact 8 is attached. This layer is provided with a substantially semi-circular indentation at the edge. In certain cases it has been found suitable to give the edge of the indentation the form of a circular art, the centre of which is outside the edge of the emitter layer.

The connection conduits 7 and 9 are rigidly connected to the base plate 2 and the contact 8. A control electrode 10 is applied at the edge of the semi-conductor body on the layer 5 (P-base). These elements together form a conventional thyristor, the main thyristor, in which the base plate 2 is anode and the contact 8 cathode.

Separate from the N-emitter layer 6 and in the indentation situated on the edge of this, another N-conducting layer 11 is arranged on the P-base layer 5. The upper surface of this layer is provided with a metal coating 12 which, on the part facing the main thyristor, is also in contact with the P-base layer 5. A cathode conductor 13 is connected to the metal coating 12. The layer 11, coating 12 and cathode conductor 13, together with the layers 3, 4 and 5 and the base plate 2 and anode conductor 7, form a conventional thyristor. This thyristor operates as auxiliary thyristor upon ignition of the main thyristor.

When the main thyristor is to be ignited a positive voltage in relation to the cathode 13 is induced in the control electrode 10. The auxiliary thyristor, which is situated next to the control electrode, is then ignited first and a powerful current in relation to the control current flows between the anode (2, 7) and the cathode (12, 13) of the thyristor. This current will pass through the coating 12 into the P-base layer 5 and flow sideways in this to the N-emitter layer 6 and cathode (8, 9) of the main thyristor, thus acting as a control current for the main thyristor.

It is of great importance that the ignited part of the thyristor increases in size as rapidly as possible since it should be possible to allow the current though the thyristor to increase as rapidly as possible without the current density in the part already ignited becoming so great that the thyristor is damaged. This can be achieved by making the ignition front, that is the boundary line sponding devices already known since the ignition tolerance is great and the need for control power is considerably decreased.

We claim:

1. Controllable semi-conductor device comprising a main thyristor and at least one auxiliary thyristor; the main and auxiliary thyristors having a common semi-conductor body with a first emitter-layer, a first main electrode connected to the first emitter-lyer, base layer and control electrode means common to both the thyristors; the thyristors having separate second emitter-layers; the second emitter layer of the main thyristor having a substantially greater area than the second emitter layer of the auxiliary thyristor; the second emitter-layer of the auxiliary thyristor being directly electrically connected by means of an external connection to the common base-layer for the thyristors which is adjacent said second emitter-layer; the second emitter layer of the main thyristor having a connection for the load current of the device; said control electrode means including a control electrode on the opposite side of the auxiliary thyristor from the main thyristor.

2. Controllable semi-conductor device according to claim 1, characterised in that an auxiliary thyristor is arranged immediately adjacent to the common control electrode.

3. Controllable semi-conductor device according to claim 2, characterised in that the second emitter-layer of the auxiliary thyristor is shaped substantially as a sector of a circle the centre of which faces the common control electrode.

4. Controllable semi-conductor device according to claim 1, characterised in that the semi-conductor body is shaped as a disc, the common control electrode and the second emitter-layer of the auxiliary thyristor being situated at the edge of the disc.

5. Controllable semi-conductor device according to claim 4, characterised in that the second emitter-layer of the main thyristor is provided with an indentation at the edge of the disc in which the second emitter-layer of the auxiliary thyristor is arranged.

6. Controllable semi-conductor device according to claim 5, characterised in that said indentation is substantially semi-circular.

7. Controllable semi-conductor device according to claim 1, characterised in that it comprises a plurality of auxiliary thyristors having separate second emitter-layers situated between the common control electrode and the main thyristor.

8. Controllable semi-conductor device according to claim 7, characterised in that the separate second emitter-layers of the auxiliary thyristors are shaped as substantially concentric annuli, the centre of which is situated in the immediate vicinity of the common control electrode.

9. Controllable semi-conductor device according to claim 1, characterised in that the electrical connection between the separate emitter layer of an auxiliary thryistor and the common base-layer comprises a metal layer.

10. Controllable semi-conductor device according to claim 1, characterised in that the electrical connection between the separate second emitter-layer of the auxiliary thyristor and the common base-layer comprises at least one contact placed on said base-layer and connected to the separate second emitter-layer of the auxiliary thyristor by means of an external connection.

11. Controllable semi-conductor device according to claim 10, characterised in that the contact is located at a point on said base-layer situated between the separate second emitter-layers of the auxiliary thyristor and the main thyristor.

12. Controllable semi-conductor device according to claim 10, characterised in that the external connection comprises an impedance element.

13. Controllable semi-conductor device according to claim 12, characterised in that the connection comprises a resistor.

14. Controllable semi-conductor device according to claim 1, characterised in that the separate emitter layers of the auxiliary thyristor and the main thyristor are connected by an impedance element.

15. Controllable semi-conductor device according to claim 14, characterised in that the impedance element comprises a resistor.

16. Controllable semi-conductor device according to claim 14, characterised in that the impedance element comprises an inductive element.

17. Controllable semi-conductor device according to claim 14, characterised in that the impedance element comprises a capacitor.

References Cited

UNITED STATES PATENTS

| | | | |
|---|---|---|---|
| 3,123,750 | 3/1964 | Hutson et al. | 317—235 |
| 3,160,800 | 12/1964 | Smart | 317—235 |
| 3,124,703 | 3/1964 | Sylvan | 317—235 X |
| 3,201,596 | 8/1965 | Longini | 317—235 X |
| 3,210,620 | 10/1965 | Lin | 317—234 |
| 3,274,460 | 9/1966 | Pessok | 317—235 |
| 3,408,545 | 10/1968 | DeCecco et al. | 317—235 |
| 3,409,811 | 11/1968 | Gerlack | 317—235 |

JAMES D. KALLAM, Primary Examiner

U.S. Cl. X.R.

317—234